(12) United States Patent
Yamabayashi et al.

(10) Patent No.: US 7,057,255 B2
(45) Date of Patent: Jun. 6, 2006

(54) PHOTODIODE, OPTICAL RECEIVER DEVICE INCLUDING THE SAME, AND METHOD OF MAKING THE PHOTODIODE

(75) Inventors: Naoyuki Yamabayashi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 185 days.

(21) Appl. No.: 10/320,194

(22) Filed: Dec. 16, 2002

(65) Prior Publication Data
US 2004/0008947 A1 Jan. 15, 2004

(30) Foreign Application Priority Data
Dec. 20, 2001 (JP) ............................. 2001-386871

(51) Int. Cl.
*H01L 31/06* (2006.01)
(52) U.S. Cl. .................. 257/461; 257/464; 257/184; 257/81; 257/434; 257/680; 438/48; 438/81
(58) Field of Classification Search ............ 257/461, 257/464, 465, 466, 431, 21, 85, 184–189, 257/81, 82, 433, 434, 680, 681; 438/48, 438/81
See application file for complete search history.

(56) References Cited

U.S. PATENT DOCUMENTS

| 6,521,968 B1* | 2/2003 | Kuhara et al. ............ 257/461 |
| 2002/0033491 A1* | 3/2002 | Kuhara et al. ............ 257/227 |

FOREIGN PATENT DOCUMENTS

| JP | 2000-105327 | 4/2000 |
| JP | 8-264748 | 10/2000 |

* cited by examiner

*Primary Examiner*—Nathan J. Flynn
*Assistant Examiner*—Scott R Wilson
(74) *Attorney, Agent, or Firm*—Fish & Richardson P.C.

(57) ABSTRACT

A photodiode (PD chip) includes a substrate, an absorption layer, a p-n junction in the absorption layer, a passivation film for protecting the end of the p-n junction, a p-electrode, and an n-electrode. The passivation film is covered with a protective layer composed of an insulative resin and having a thickness larger than that of the passivation film such that the passivation film of the PD chip fixed to the Si wafer and hence the p-n junction are not damaged or contaminated when an Si wafer including a number of horizontally and vertically arranged chip units, each having a V-groove for fixing an optical fiber, a marker, and a metallized pattern, is diced. Thus, a low-cost optical receiver module that does not generate dark current can be produced.

10 Claims, 8 Drawing Sheets

SECOND EMBODIMENT
REAR ILLUMINATED TYPE

CONVENTIONAL TYPE

FIG. 10

CONVENTIONAL TYPE

CONVENTIONAL TYPE

FIG. 14

CONVENTIONAL TYPE

FIG. 15

PHOTODIODE, OPTICAL RECEIVER DEVICE INCLUDING THE SAME, AND METHOD OF MAKING THE PHOTODIODE

BACKGROUND OF THE INVENTION

1. Field of the Invention

The present invention relates to photodiodes having p-n junctions, and particularly relates to a photodiode suitable for optical communication, an optical receiver device including the photodiode, and a method of making the photodiode.

2. Description of the Related Art

A typical widely used photodiode module is accommodated in a coaxial type metal package with a lead pin. A front illuminated photodiode ID) chip is fixed to the surface of a stem. A lens and an optical fiber are fixed in axial alignment on the PD chip, and the module is sealed hermetically. Signal light having propagating through the optical fiber is converged by the lens and is incident on the top of the PD, which converts the light into a photocurrent. The device is tightly sealed in the metal package to ensure stable characteristics and a prolonged lifetime with high reliability. However, such a photodiode module inevitably requires axial alignment and use of an expensive metal package, which results in high material and process costs and bulkiness. Thus, inexpensive and compact photodiodes are required.

Figure 9:
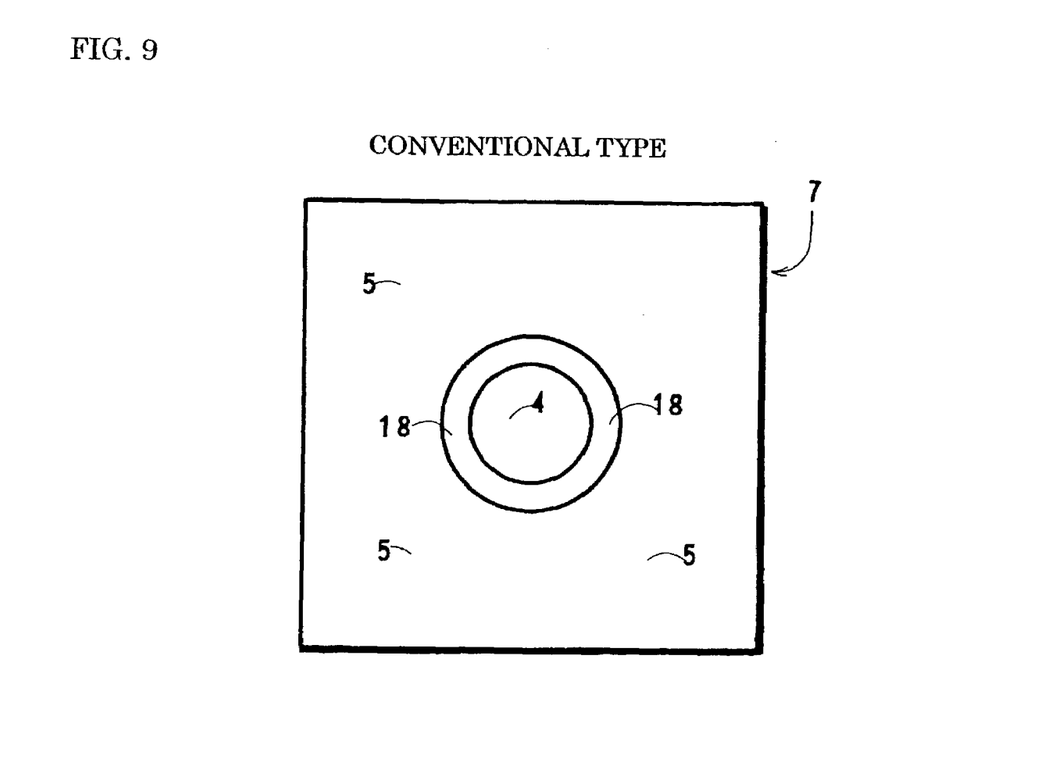
FIG. 9 is a plan view of a conventional rear illuminated PD having a substrate, an absorption layer, a central p-n junction, a passivation film, an n-electrode, and a p-electrode.
Figure 10:
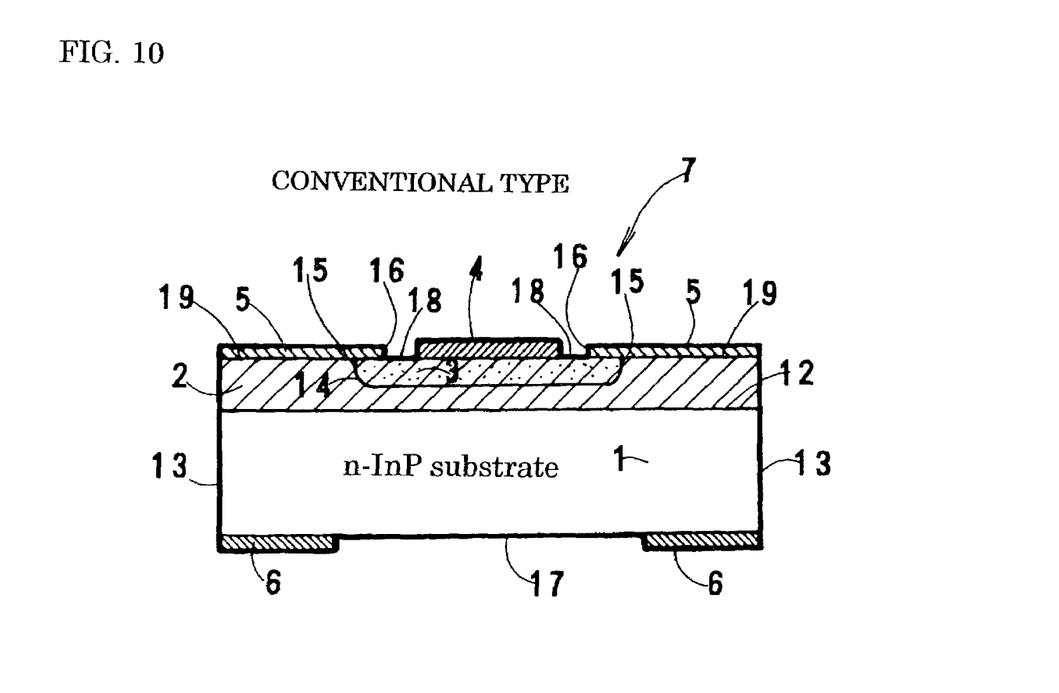
FIG. 10 is a longitudinal cross-sectional view of the conventional photodiode in FIG. 9.

For the purpose of reduced costs, a planar lightwave circuit (PLC) type of photodiode has been developed in which a rear illuminated PD chip is mounted onto an Si (silicon) substrate. FIGS. 9 and 10 show a structure of a known rear illuminated PD. An absorption layer is provided on a substrate and a p-n junction is formed such that a p-electrode and an n-electrode are respectively provided on the top and the bottom of the device. The semiconductor layers are composed of various materials depending on the wavelength of incident light.

For example, in a photodiode 7 having a p-n junction used in optical communication in the wavelength range of 1.0 µm to 1.6 µm, an n-InGaAs absorption layer 2 is epitaxially grown on an n-InP substrate 1, and a p-type impurity such as zinc is diffused into the center of the n-InGaAs absorption layer 2 to form a p-type region 3. A p-electrode 4 is provided on the p-type region 3 and an annular n-electrode 6 is formed on the bottom of the n-InP substrate 1. The n-electrode 6 has an annular shape so that light is incident on the rear face (bottom face). Since the light is not incident on the top face, the p-electrode 4 has a circular shape having a large area. A passivation film 5 made of, for example, SiN is provided around the peripheral region of the p-electrode 4 on the top face. In this device, the passivation film 5 also covers a peripheral region 19 of the top face of the crystal. Referring to FIG. 9, the p-electrode 4 and the passivation film 5 are concentric on the top face. An n-InP cap layer may be provided on the n-InGaAs absorption layer 2 in some cases.

A boundary 12 between the n-InP substrate 1 and the n-InGaAs absorption layer 2 is not a p-n junction and can be exposed to side faces 13 of the chip. A dished boundary between the p-type region 3 and the n-InGaAs absorption layer 2 is a p-n junction 14. The p-type region 3 is formed by impurity diffusion through a mask on the peripheral region of the chip; the dished boundary is thereby formed. The end 15 of the p-n junction 14 is exposed to the top face, as opposed to the side faces. The end 15 of the p-n junction 14 is covered with the insulative passivation film 5 to prevent deterioration of the device starting from the p-n junction end 15.

Signal light is incident on a rear opening 17. A reverse bias from an external circuit is applied between the p-electrode (anode) 4 and the n-electrode (cathode) 6. The signal light that enters the p-n junction 14 through the absorption layer 2 generates electron-hole pairs. An electric field generated by the reverse bias moves the carriers to generate a photocurrent. The photocurrent is taken out into the external circuit and the optical signals can be converted into electrical signals.

Figure 11:
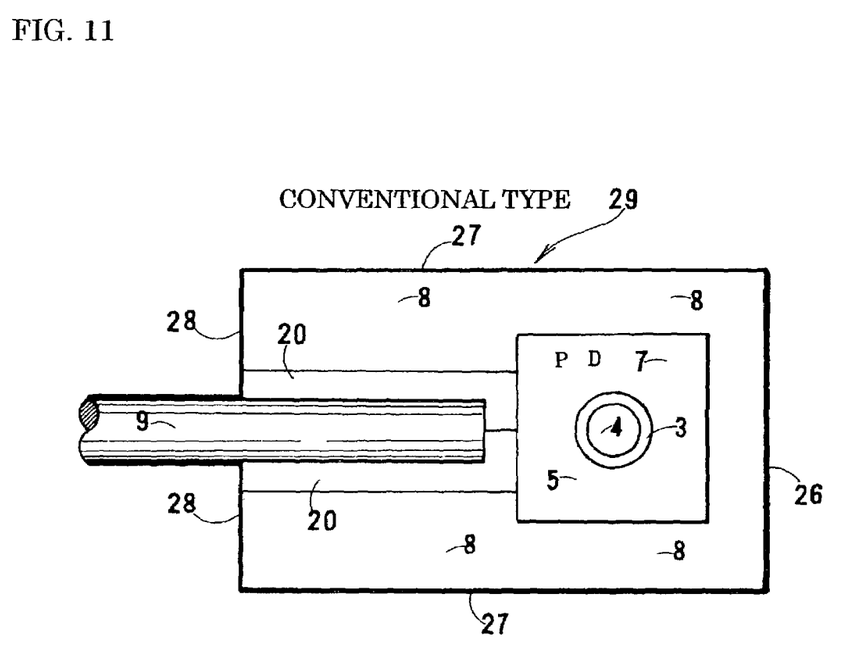
FIG. 11 is a plan view of a surface mounting PD module in which a rear illuminated PD and an optical fiber are attached to a rectangular Si bench having a V-groove.
Figure 12:
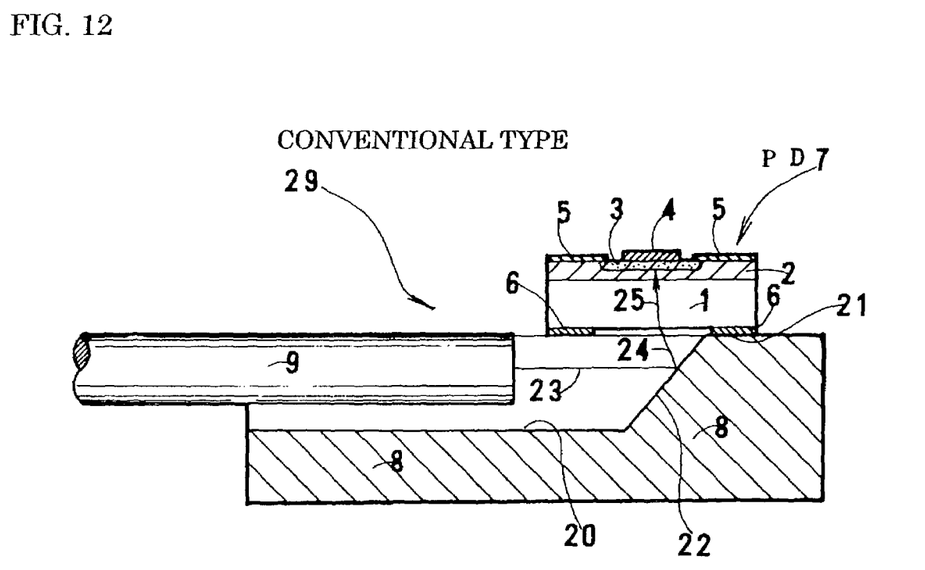
FIG. 12 is a longitudinal cross-sectional view of a surface mounting PD module in which a rear illuminated PD and an optical fiber are attached to a rectangular Si bench having a V-groove.

FIGS. 11 and 12 are respectively a plan view and a longitudinal cross-sectional view of a surface mounting optical receiver device including the rear illuminated PD 7. V-shaped grooves, markers, and a metallized pattern for forming a number of chips are formed on a large disk Si wafer along the cleavage by photolithographic processes, such as vapor deposition, sputtering, or etching. The wafer is cut along the cleaved surface into rectangular chips with predetermined sizes. Each chip is called an Si bench 8.

A V-groove 20 extends to the midway of the rectangular Si bench 8 along the central axis parallel to the long sides of the Si bench 8. A metallized pattern is provided on the Si bench 8 by printing or vapor deposition. When an optical transmission medium is an optical fiber, the V-groove is used. When the optical transmission medium is a light waveguide, the light waveguide is preliminarily formed on the Si bench. Although the optical transmission medium may be a light waveguide, in the following description, it is an optical fiber and the V-groove is provided. The above-described process is a wafer fabrication process.

The following is a chip fabrication process after a wafer is separated into Si benches. A rear illuminated PD 7 is fixed on a metallized pattern 21 at the edge of the V-groove according to a marker. The annular n-electrode 6 at the bottom of the PD 7 is fixed to the metallized pattern 21 with solder. The bonded interface between the PD 7 and the Si bench 8 has a U shape and is stable, although the bonding state is not clear in FIG. 12. A structure in which the PD 7 is mounted on the Si bench 8 is called a submodule 29.

An optical fiber 9 is placed and fixed with a resin (not shown) in the V-groove 20. The V-groove 20 has an inclined reflective plane 22 at the end. The V-groove 20 and the reflective plane 22 are filled with a transparent resin (not shown). The signal light 23 emerging from the optical fiber 9 is reflected by the reflective plane 22. The reflected light 24 is refracted at the rear face of the PD 7, and the refracted light 25 reaches the p-n junction in the center of the light receiving section to generate a photocurrent. The light from the optical fiber propagates parallel to the Si substrate plane, and the light incident surface of the PD is parallel to the optical axis. Thus, the reflective plane 22 is essential for directing the light toward the PD.

Figure 8:
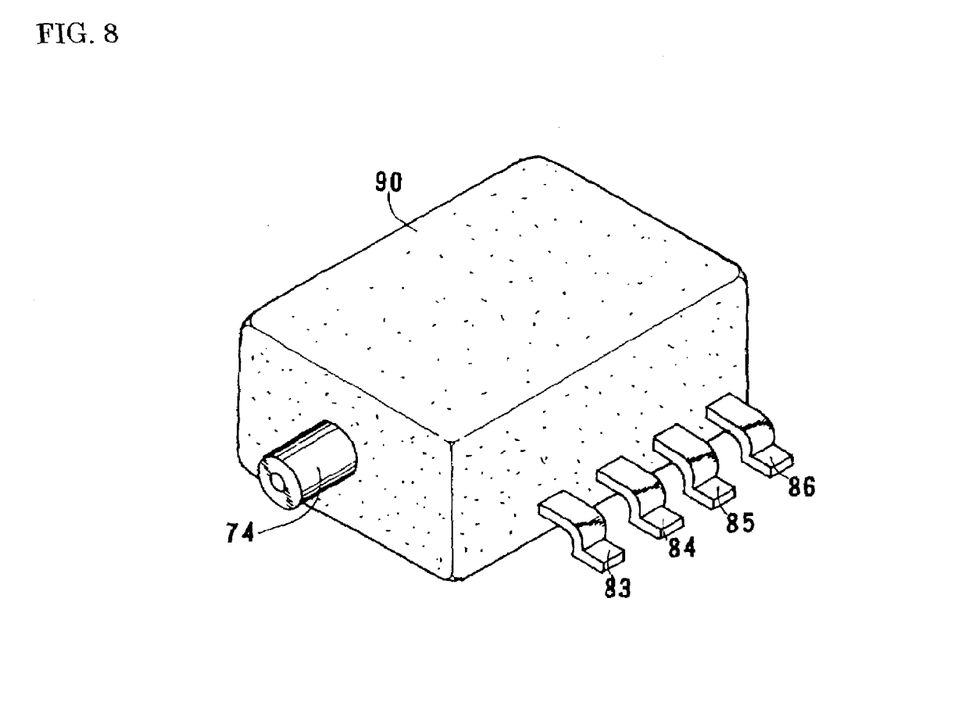
FIG. 8 is an isometric view of a device in which a PD chip having a protective layer is fixed to an Si bench, a lead frame is provided, and the assembly is accommodated in a package.

FIGS. 11 and 12 show an assembly of the submodule and the optical fiber. The assembly is placed onto a lead frame (a thin metal plate having many leads), the metallized pattern is wire-bonded with the leads, and the entity with the Si bench and the lead frame is molded into, for example, an epoxy resin to form a plastic-packaged device, as shown in FIG. 8.

A reason for the use of the Si bench 8 as a receptacle of the chip and optical fiber is that fine structures such as oxide films and a metallized pattern can be readily formed by matured Si semiconductor production processes. Furthermore, the V-groove 20 and the reflective plane 22 can be precisely formed by anisotropic etching of the single-crystal silicon. In addition, markers for fixing the chip can be precisely formed. The single-crystal silicon having such advantages is preferentially used.

The inventors of the present invention have proposed various surface mounting PD modules including the rear illuminated PD chips. For example, Japanese Unexamined Patent Application Publication No. 2000-105327 entitled "OPTICAL RECEIVER MODULE" discloses a PD module in which a V-groove having a reflective plane is formed on an Si bench, an optical fiber is fixed onto the V-groove, a rear illuminated PD chip is placed onto the Si bench face above the reflective plane at the end of the optical fiber, and the assembly is covered with a transparent resin.

Such a surface mounting photodiode module is prepared as follows: Rectangular chips (Si benches or Si substrates) are prepared by cutting an Si wafer, and a PD chip is provided onto each Si bench.

Japanese Unexamined Patent Application Publication No. 8-264748 entitled "OPTICAL WAVEGUIDE INTEGRATED CIRCUIT DEVICE AND MANUFACTURING METHOD THEREOF" discloses an invention of a lightemitting device (LD) module including an LD. A deep recess with a depth D and a rectangular groove adjoining the recess are formed on an Si bench by etching. A thin LD with a thickness d is placed on the deep recess (d<D), and the assembly is covered with a transparent resin. Another transparent resin having a slightly different refractive index is used for the rectangular groove to provide a core-clad structure, so that the end of the core connects to an LD stripe (light emitting layer).

Such a chip-embedded LD module is also prepared as follows: Grooves, patterns, and markers are formed on an Si wafer, and the wafer is cut into chips (Si benches). An LD is placed onto each Si bench and a transparent light waveguide is formed. After wire bonding, the entity of the assembly is covered with a transparent resin.

Japanese Unexamined Patent Application Publication No. 8-264748 discloses a method for making a combined LD module on an Si substrate. A plurality of LD modules, for example, five LD modules are transversely arranged and are driven with one driver IC.

Figure 13:
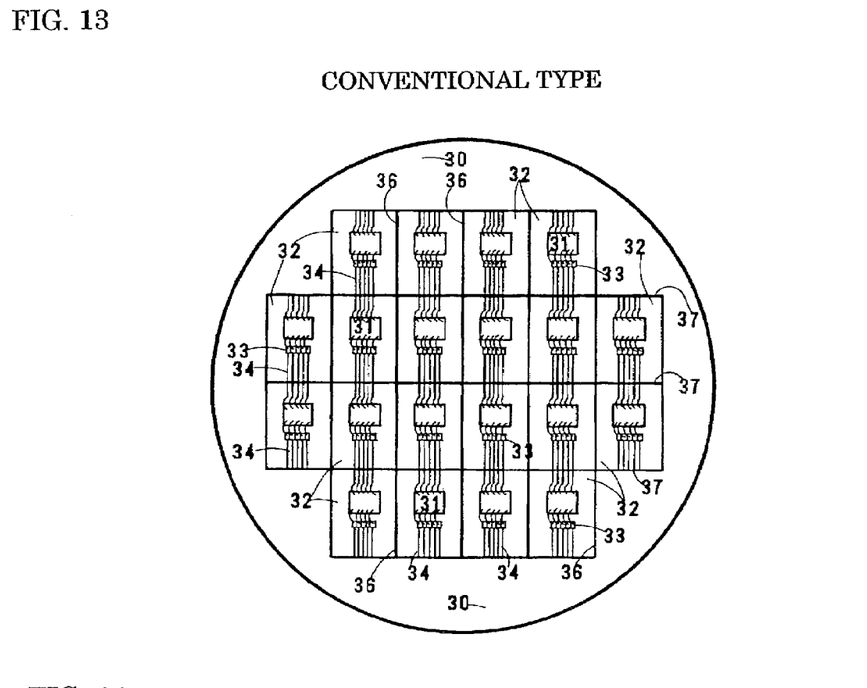
FIG. 13 is a plan view in which a number of receiver module chips are formed in an Si wafer shown in FIG. 9 of Japanese Unexamined Patent Application Publication No. 8-264748 and ICs and LDs are mounted.

FIG. 13 is a plan view of an Si wafer in the final step of such a wafer fabrication process. Many chip units 32 are formed on an Si wafer 30. A common driver IC 31, a plurality of LDs 33, and a plurality of resin waveguides 34 are formed on each chip unit 32. These LDs 33 are wirebonded to the common driver IC 31, and the light waveguides and the LDs are covered with a transparent resin. The Si wafer 30 is cut along vertical scribing lines 36 and horizontal scribing lines 37 into individual chip units 32. Each chip unit 32 is provided with five resin waveguides, five LDs, a common driver IC, wiring (wire bonding), and a transparent resin cover. Thus, the chip unit 32 can be directly mounted to a lead frame and be accommodated into a package.

One Si wafer includes several hundred chips (Si benches) of photodiode modules. If PD chips are simultaneously mountable, the process time can be significantly reduced. However, only a PD mounting step can precede the chipdicing step. A wire bonding step and a resin application step must be performed after the chip-cutting step.

It is difficult to transfer a wired wafer after wire bonding and to scribe it by using a scriber without damaging the wires.

We will now forecast new problems that would arise if the PD was mounted in a step of the wafer fabrication process for the surface mounting PD module, although no example of a scribing step after mounting of the PD onto the Si wafer is actually known.

In conventional methods, chip units or submodules including V-grooves and metallized patterns are formed on an Si wafer and are cut along vertical and horizontal scribing lines. In the scribing step, the Si wafer is fixed and is diced along scribing lines with a rotating blade while a cutting solution is being supplied. The chips are then cleaned.

Since the Si wafer has a considerable thickness, chips may be damaged by the mechanical dicing and will be contaminated by dicing chips. Although the contaminations such as dicing chips and cutting solution residue can be removed by cleaning to some extent, sticky fine contaminations cannot be easily removed.

If the PD chips are fixed to a wafer before dicing, the PD chips will also be subjected to shock from dicing. Such shock has not been considered with respect to PDs made by the conventional method. When dicing is performed along the scribing lines on the Si wafer, chips may damage the passivation films of the PD chips. Furthermore, mobile ions such as sodium ions may adhere. Removal of the contaminations such as sodium ions adhered to the PD chips is extremely difficult. Such contaminations may reach the ends of the p-n junction and may impair the function of the p-n junction. As a result, a dark current that flows when no light is incident in a reverse bias mode may increase, thus increasing noise.

Figure 14:
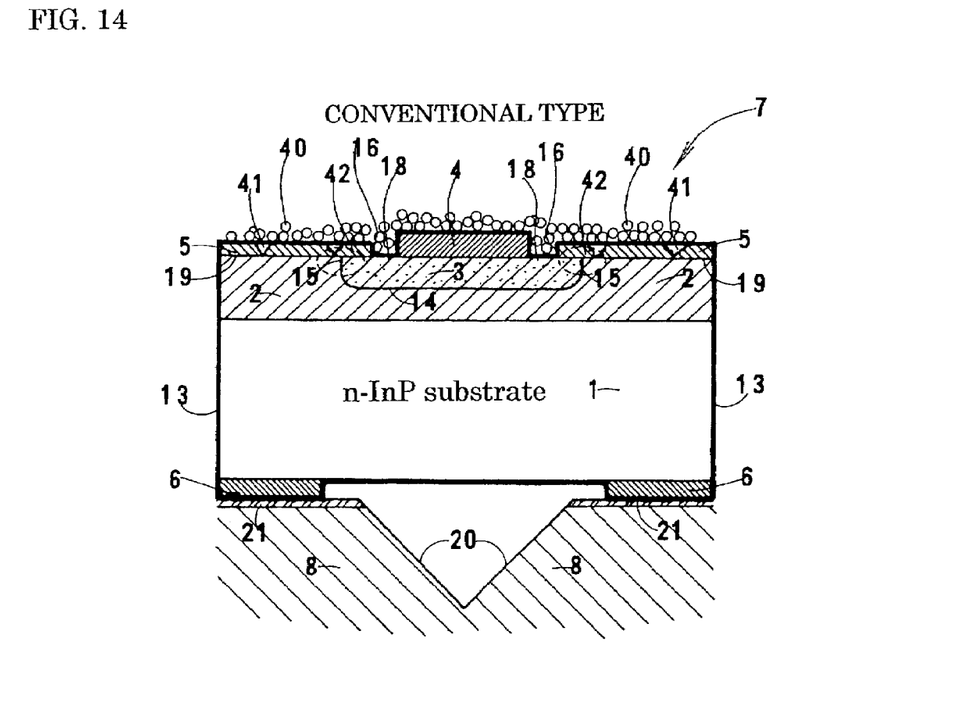
FIG. 14 is a cross-sectional view of a PD chip for illustrating deterioration of a p-n junction due to damages of a passivation film of a PD by contaminations that are generated when an Si wafer is diced along vertical and horizontal scribing lines while supplying a dicing solution after a number of receiver module chips are produced on the Si wafer and the PD is mounted.

FIG. 14 is a cross-sectional view of a rear illuminated PD 7 after dicing in the case where the PD was placed on an Si bench 8 and dicing was performed. Many contaminations 40 adhere to the top face of the PD 7 as a result of dicing the Si wafer provided with the PD. Such contaminations would adhere to the side and rear faces of the PD 7 but they are not depicted in the drawing. Contaminations 40 spread over the p-electrode 4, the passivation film 5, and a gap 18. In FIG. 14, the contaminations 40 represented by circles include fine particles such as sodium ions, as well as the dicing chips and cutting solution particles. Shock from dicing may cause damages 41 on the thin insulative passivation film 5. Furthermore, the contaminations 40 may penetrate into narrow gaps between the crystal layer and the passivation film 5. In particular, sodium ions will readily penetrate into such narrow gaps.

Although the passivation film 5 covers the ends 15 of the p-n junction, the contaminations 40 may reach vicinities 42 (surrounded by broken lines) of the end of the p-n junction from an exposed portion 18 through a gap between the passivation film 5 and the crystal surface. If so, a dark current generated by leakage of carriers from the p-n junction increases, resulting in an increase in noise and deterioration of receiving performance. Such a dark current may cause malfunction of the device at high environmental temperatures, since the thermal changes of dark current is significant.

Sodium and other ions that do not penetrate into the passivation film 5 adhere to the surface of the passivation film 5. Since the passivation film 5 is extremely thin, for example, about 0.1 to 0.5 μm, a local electric field generated by the adhered ions distorts the distribution of an electric field in the vicinity 42 of the end 15 of the p-n junction. Such a phenomenon may cause a local change of a p-type into an n-type or a local change of an n-type into a p-type. This phenomenon is called generation of an inversion layer. As a result of the generation of the inversion layer, part of the p-n junction is extremely thinned and causes an increase in dark current due to breakdown. The noisy dark current causes deterioration of the receiving characteristics and inhibits receiving high-frequency pulse signals.

It is well known that mobile ions such as sodium ions adhered to the photodiode increase a dark current. Thus, after the p-n junction and the passivation film of the photodiode are formed, a final chip making step and a packaging step are normally performed in a clean environment to prevent contamination to the extent possible.

The new process, in which PD chips are fixed onto an Si wafer and then dicing is carried out to separate the wafer into the PD chips, will cause new problems as described above, i.e., contamination at the vicinities 42 of the ends of the p-n junction and the exposed portions 18, and an increase in dark current. Such a process has never been performed, however; hence, the above problems are not actually observed. Dicing involves mechanical cutting in which a lubricant oil and an abrasive agent (including abrasive powder and chemical agent) are applied and a rotating blade is brought into direct contact with the wafer; hence, the PD will be significantly contaminated.

SUMMARY OF THE INVENTION

A photodiode according to the present invention comprises a substrate; an absorption layer; a p-n junction in the absorption layer; a passivation film for protecting the p-n junction; a p-electrode; and an n-electrode, wherein the passivation film is covered with a protective layer that is composed of an insulative resin and has a thickness larger than that of the passivation film.

In the photodiode according to the present invention, the protective layer may cover at least the inner end of the passivation film and the adjoining portion thereof above the p-n junction.

The passivation film is composed of a hard and thin inorganic substance. The protective layer may be composed of a substance different from that for the passivation film, for example, a polymer. The polymer protective layer can be formed by spin-coating and curing a liquid raw material. Thereby a protective layer with a required thickness can be readily formed and does not generate internal stress in the underlying passivation film even if the thickness of the protective layer is thick. The protective layer may comprise any one selected from the group consisting of a polyimide resin, a fluorinated polyimide resin, polymethyl methacrylate resin, an epoxy resin, and an ultraviolet-curable resin. The protective layer must be thick. Preferably, the thickness of the protective layer may be 10 times to 100 times the thickness of the passivation film. Preferably, the protective layer may have a thickness in the range of 5 µm to 50 µm.

The photodiode according to the present invention may further comprise a conductive film extending from an electrode located at the side where the protective layer exists to the surface of the protective layer and a part of the conductive film may function as a bonding pad for electrical connection with an exterior.

The photodiode according to the present invention may be of a front illuminated type, and the protective layer may comprise a transparent resin that also covers the surface of the absorption layer.

In the photodiode according to the present invention, preferably the substrate may be an InP substrate, the absorption layer may be an InGaAs or InGaAsP absorption layer, and the p-n junction may be formed by zinc diffusion.

Alternatively, in the photodiode according to the present invention, the substrate may be an n-InP substrate, the absorption layer may be an InGaAs or InGaAsP absorption layer, the p-n junction may be formed by zinc diffusion, an n-InP buffer layer may be provided between the n-InP substrate and the absorption layer, and an n-InP cap layer may be formed on the absorption layer.

The photodiode according to the present invention may further comprise a diffusion shielding portion that forms another p-n junction surrounding the p-n junction that exists in the area where light is to be incident.

An optical receiver device according to the present invention comprises an Si bench having a V-groove and a metallized lead; an optical fiber fixed in the V-groove; and a PD chip which is attached in the vicinity of the end of the V-groove and in which a passivation film for protecting a p-n junction is covered with a protective layer composed of an insulative resin.

According to the present invention, the PD chips can be mounted before the Si wafer is divided into individual chips, since the thick protective layer covers the passivation film and the exposed portion on the top of the PD chips.

Since the passivation film is protected by the protective layer, the passivation film is not damaged during dicing of the Si wafer. Contaminations do not reach the rear of the passivation film. Even if the contaminations remain on the protective layer, the contaminants are distanced from the p-n junction by the thick protective layer and do not electrostatically affect the p-n junction. Furthermore, deterioration of the PD does not occur during dicing.

Since a number of PD chips can be mounted onto the Si wafer in the wafer fabrication process, the production cost can be further reduced. Consequently, high-performance surface mounting photodiode modules with low dark current can be provided at reduced costs.

DETAILED DESCRIPTION OF THE INVENTION

The preferred embodiments of the present invention will now be described with reference to the drawings. For simplicity, the same components in these drawings are referred to by the same reference numerals.

In the PD chip of the present invention, a passivation film is covered with an insulative protective layer. Since the passivation film covers the end of the p-n junction to stabilize the p-n junction, stabilization of the p-n junction is enhanced by both the protective layer and the passivation film. Thus, deterioration of the p-n junction is not caused by dicing of the Si wafer. Although the protective layer need not cover the entire passivation film, it must cover at least the inner end of the passivation film, in order to prevent penetration of contaminations between the passivation film and the crystal.

The passivation film is an insulative film that is made of SiN, SiON, SiO$_2$, or AlN and has a thickness in the range of 0.1 to 0.5 μm. Preferably the protective layer is thicker than the passivation film so that the passivation film is not damaged even if the protective layer is damaged. Although the protective layer partly covers the p-electrode, since the p-electrode should be partly exposed for ensuring wire bonding thereof. The diameter of the p-electrode is generally in the range of about 50 to 300 μm, depending on the speed of the response of the PD. As the speed of the response increases, the electric capacitance must be decreased. Thus, the diameter must be decreased. In view of the balance with the size of the p-electrode, the thickness h of the protective layer is preferably 50 μm or less. Accordingly, the protective layer preferably has a thickness h in the range of 0.1 μm to 50 μm.

The ratio h/p of the thickness h of the protective layer to the thickness p of the passivation film is in the range of about 1 to 500. More preferably, the ratio h/p is 10 to 100, since the protective layer should have a considerable thickness for ensuring protection of the passivation film. Thus, the thickness h of the protective layer is more preferably 5 μm to 50 μm.

The passivation film is made of SiN or SiO$_2$. It is unsuitable to form the protective layer using the same dielectric material. A thick dielectric layer generates large stress and thus it cannot be uniformly deposited on the semiconductor crystal. Furthermore, the deposited dielectric layer generates large internal stress that causes separation from the semiconductor crystal and cracks. In addition, the underlying crystal layers (InP and InGaAs) and the passivation film have significantly different coefficients of thermal expansion, which generate mechanical stress in the vicinity of the p-n junction. As a result, disturbance of the electric field may occur at the end of the p-n junction. Thus, the passivation film must have a small thickness, for example, in the range of 0.1 μm to 0.5 μm. The protective layer must be composed of a more resilient material in which stress does not occur even if the protective layer is thicker.

On the other hand, it is unsuitable to form the dielectric passivation film using the insulative resin that is used for the protective layer. The reason is as follows: The passivation film, which is provided for protecting the p-n junction, also functions as a mask in zinc diffusion. An SiN mask is formed by sputtering or chemical vapor deposition (CVD) on a wafer comprising an n-InP substrate and n-InGaAs absorption layer epitaxially grown thereon (An InP window layer may be deposited on the n-InGaAs absorption layer). A hole is provided in the central region of the chip and zinc is diffused by vapor phase diffusion. Zinc is diffused into the InGaAs layer through the hole to form a p-type region. Since this diffusion is thermal diffusion, zinc reaches toward a portion below the SiN mask such that the end of the p-n junction is protected by the mask, as shown in FIG. 10.

As described above, the passivation film also functions as a zinc diffusion mask. Zinc diffusion is performed at a high temperature in the range of 500° C. to 600° C. The insulative resin generally has a heat endurance limit of about 300° C. If the passivation film is composed of the insulative resin, it is not resistant to a diffusion temperature in the range of 500° C. to 600° C. Accordingly, the insulative resin cannot be used as the diffusion mask.

As a compromise method, a thermally resistive SiN mask might be formed on the crystal and zinc is diffused through a hole provided in the mask. The SiN mask is removed and an insulative resin is coated on the same position. However, this process has some disadvantages. Since the SiN film functions as both a zinc diffusion mask and a passivation film, the p-n junction can be thereby protected. If the SiN mask is removed after the zinc diffusion, the p-n junction is exposed to an etching solution, resulting in deterioration of the p-n junction. Furthermore, the p-n junction is exposed to air after removing of etching solutions and cleaning by pure water, which causes the p-n junction to undergo deterioration by oxidation. After the p-n junction is formed by the zinc diffusion, the end of the p-n junction should not be exposed to the exterior. Accordingly, it is not suitable to employ the method in which zinc diffusion is performed using an SiN mask to form the p-n junction, and then the SiN mask is removed to apply the insulative resin.

Therefore, a resin protective layer must be provided on an SiN passivation film to protect the end of the passivation film and the exposed portion.

The present invention is applicable to a front illuminated PD, as well as the rear illuminated PD. In the front illuminated PD, the protective layer has a central opening to expose the p-electrode. Light can enter the device through the central opening of the protective layer and the annular p-electrode.

Herein described is a case in which the substrate is made of n-InP and the absorption layer is made of an InGaAs ternary material highly sensitive to the wavelength range of 1 to 1.6 µm. In the present invention, however, the absorption layer may be made of an InGaAsP quaternary material. The InGaAsP layer has a narrower sensitive region. The present invention is also applicable to an Si PD having sensitivity to visible light and a Ge PD having sensitivity to near infrared. In order to enhance protection of the p-n junction, the resin protective layer is formed on the passivation film of a PD in which the p-n junction is formed by thermal diffusion of an impurity from the hole of the dielectric mask and the end of the p-n junction is covered with the mask (passivation film).

The passivation film functioning as the diffusion mask may be made of a heat-resistive dielectric layer such as SiN, SiON, $SiO_2$, and AlN.

Materials suitable for the protective layer are insulative polymers that can be coated into a uniform thickness by a spin coating process. Examples of such materials include polyimide resins, fluorinated polyimide resins, polymethyl methacrylate resin, epoxy resins, and ultraviolet-curable resins. The central hole (opening) of the protective layer may be formed by photolithography.

On the structure of the Si bench, an optical fiber may be provided in a V-groove or a light waveguide may be provided without providing the V-groove. These Si benches are integrally produced in the Si wafer step The PD chips provided with the protective layers are consecutively mounted before dicing of the Si wafer. Next, the Si wafer is divided by dicing into small rectangular Si benches which are called submodules. When a V-groove is provided on the submodule, an optical fiber is fixed into the V-groove. The PD is bonded onto a metallized pattern of Si bench, and they are attached to a lead frame, and wire-bonded to the lead frame, respectively. The resulting assembly is accommodated into a resin package by transfer molding. An example of the resin used in the package is epoxy resin. A device is thereby completed. When a light waveguide is formed on the Si bench, the end face of the light waveguide is exposed and is brought into physical contact with the optical fiber.

Figure 1:
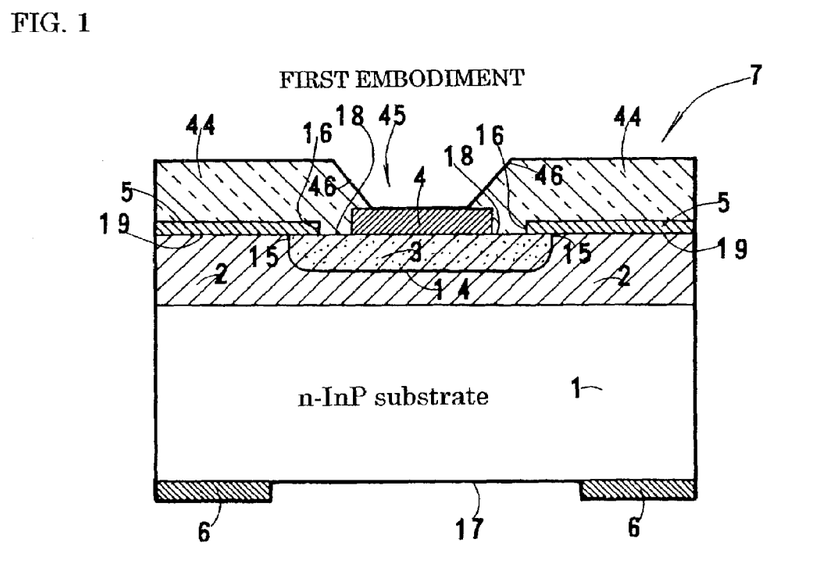
FIG. 1 is a longitudinal cross-sectional view of a rear illuminated photodiode according to a first embodiment of the present invention in which a passivation film and an upper exposed portion are covered with a protective layer and a diffusion shielding layer is not provided.
Figure 2:
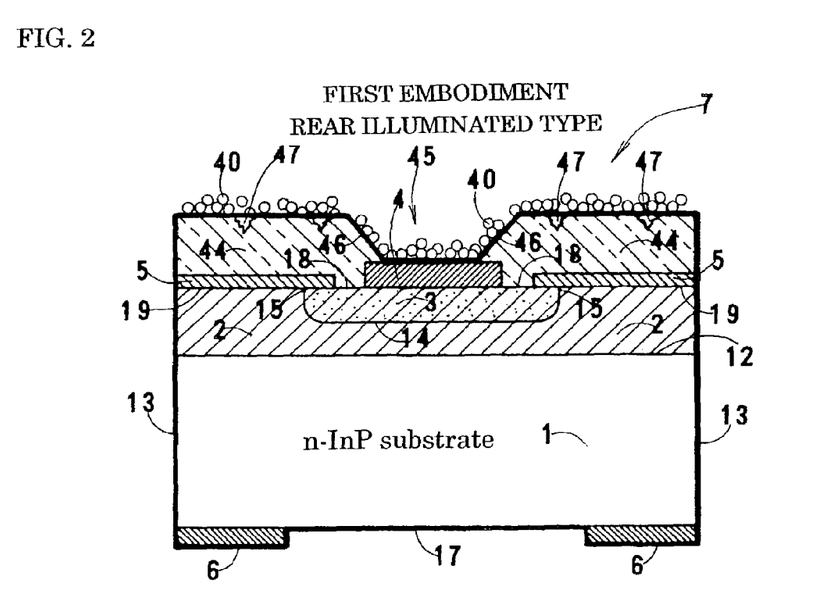
FIG. 2 is a longitudinal cross-sectional view illustrating protection of the passivation film by the protective layer when the photodiode of the first embodiment is contaminated during dicing of an Si wafer to which the photodiode is mounted.

FIRST EMBODIMENT (REAR ILLUMINATED TYPE PD: FIGS. 1 AND 2)

FIG. 1 is a cross-sectional view of a rear illuminated PD provided with a protective layer according to a first embodiment of the present invention. An n-InGaAs absorption layer 2 is deposited on an n-InP substrate 1 by epitaxial growth. The center of the n-InGaAs absorption layer 2 is a p-type region 3 formed by zinc diffusion. A dish-shaped p-n junction 14 is formed in the n-InGaAs absorption layer 2. A p-electrode 4 is formed on the center of the p-type region 3. The p-electrode 4 is made of a titanium/gold alloy. A passivation film 5 is formed on the peripheral region of the top face of the p-type region 3. The passivation film 5 also covers the peripheral regions 19 of the top face of the n-InGaAs absorption layer 2. The end 15 of the p-n junction is located under the passivation film 5 and away from the inner end 16 thereof. An annular n-electrode 6 is formed on the rear face (bottom face) of the n-InP substrate 1. The n-electrode 6 is made of AuGeNi. The bottom face has an opening 17 for receiving signal light.

A resin protective layer 44 covers the passivation film 5 and an exposed portion 18. The protective layer 44 overlaps the p-electrode 4. The protective layer 44 has a central opening 45 so that the p-electrode 4 is exposed. The wall portion of the opening 45 in the protective layer is an inclined plane 46 having a cone-shaped cross-section. The first embodiment is characterized in that the protective layer 44 covers the passivation film 5 and the peripheral region 19 of the p-electrode 4. The protective layer 44 also covers a gap between the p-electrode 4 and the passivation film 5.

The n-InP substrate 1 has a thickness of, for example, 300 µm. The n-InGaAs absorption layer 2 has a thickness of, for example, 5 µm. The passivation film 5 is made of SiN and has a thickness in the range of 0.1 to 0.5 µm.

A method for making the PD will now be described. An n-InP wafer with a thickness of 300 µm is prepared. The InP wafer has a diameter of about 2 to 4 inches. An n-InGaAs layer with a thickness of 5 µm is epitaxially deposited on the n-InP wafer, which functions as a substrate. An SiN film with a thickness of 0.1 µm is formed on the n-InGaAs layer. In general, the SiN film has a thickness in the range of 0.1 to 0.5 µm. The SiN film functions as a zinc diffusion mask and a passivation film. Holes are provided in the SiN film by photolithography at respective portions corresponding to chip units, and zinc is thermally diffused through the holes. Since the zinc reaches toward a portion below the SiN mask by the effect of heat, the end of a p-n junction 14 is formed below the mask. Thus, the end of the p-n junction 14 is protected by the SiN film from the beginning of its formation. A p-type region 3 is also formed by zinc diffusion. The p-type region is formed in the n-InGaAs layer; hence, the portion where the carrier concentrations n and p are equal is the p-n junction 14. A p-electrode 4 made of a titanium/gold alloy is provided on the p-region and an annular n-electrode 6 made of AuGeNi is provided on a position corresponding to each chip unit at the bottom surface of the n-InP wafer.

A resin protective layer 44 is coated on the top face. For example, a layer having a uniform thickness is provided by spin coating of a liquid polymer. The protective layer 44 has a thickness in the range of 0.1 to 50 µm or preferably 5 to 50 µm. The coated resin is cured by heat or ultraviolet rays according to the properties of the resin. An opening 45 is formed by photolithography in the center thereof for each chip unit. In this embodiment, a polyimide protective layer 44 with a thickness of 10 µm is provided. The above-described processing is a wafer fabrication process.

A number of semifinished PDs are produced on the InP wafer in this state. Since the wafer is extremely thin, the wafer can be divided into individual chips by spontaneous cleavage. Thus, a large number of discrete chips are obtained.

For substrates used for substrate mounting, a large-sized Si wafer having a diameter of 8 or 12 inches are prepared, in which, a V-groove, marker, metallized pattern, and the like are formed at one swoop for each of a number of Si benches by CVD, sputtering, photolithography, and the like. In conventional methods, the Si wafer is subjected to dicing at this stage. In the present invention, however, the above PD chip with the protective layer is mounted onto each Si bench in the Si bench position in the Si wafer, and then the Si wafer is mechanically diced along horizontal and vertical lines into individual Si benches with the PD chips.

In order to reduce friction of a blade during dicing, a cutting solution is supplied. The residue of the solution, dicing chips, and mobile ions remain on each Si bench and cannot easily be removed by cleaning. Contaminations would remain on an Si bench and PD chips. FIG. 2 shows an after-dicing state of contamination of the PD chip fixed on the diced Si bench. Contaminations 40 remain on the upper face of the PD, but are not in contact with the passivation film 5 by the blocking effect of the protective layer 44. The protective layer 44 partially extends on the p-electrode 4 and thus prevents the contaminations from coming into contact with the surface of the n-InGaAs absorption layer 2. The thick protective layer 44 highly protects the passivation film 5 and the exposed portion 18, so fine substances such as sodium ions do not reach to the end 15 of the p-n junction. Accordingly, the p-n junction 14 is not damaged and no inversion layer is formed. Although the side faces 13 of the PD 7 are exposed, the boundary 12 of the absorption layer is insensitive to the contaminations, since the boundary 12 is not the p-n junction. The contaminations 40 cannot reach to the sensitive regions, i.e., the end 15 of the p-n junction, the exposed portion 18 of the p-type region, which are completely covered with the protective layer 44.

An optical fiber is fixed in the V-groove of each separated Si bench, and wire-bonding for the PD and the metallized lead pattern is performed. The assembly is bonded to a lead frame, and the lead and the metallized pattern is wire-bonded to each other. The resulting assembly is placed into a package to complete a PD module (optical receiver module) shown in FIG. 8. The elements of device, other than a ceramic ferrule 74 for inserting the optical fiber and lead pins 83, 84, 85, and 86 for supplying electrical signals, are embedded into an epoxy resin package 90 by transfer molding, and is protected from exposure to air.

SECOND EMBODIMENT (REAR ILLUMINATED TYPE PD: DIFFUSION SHIELDING LAYER, FIG. 3)

Figure 3:
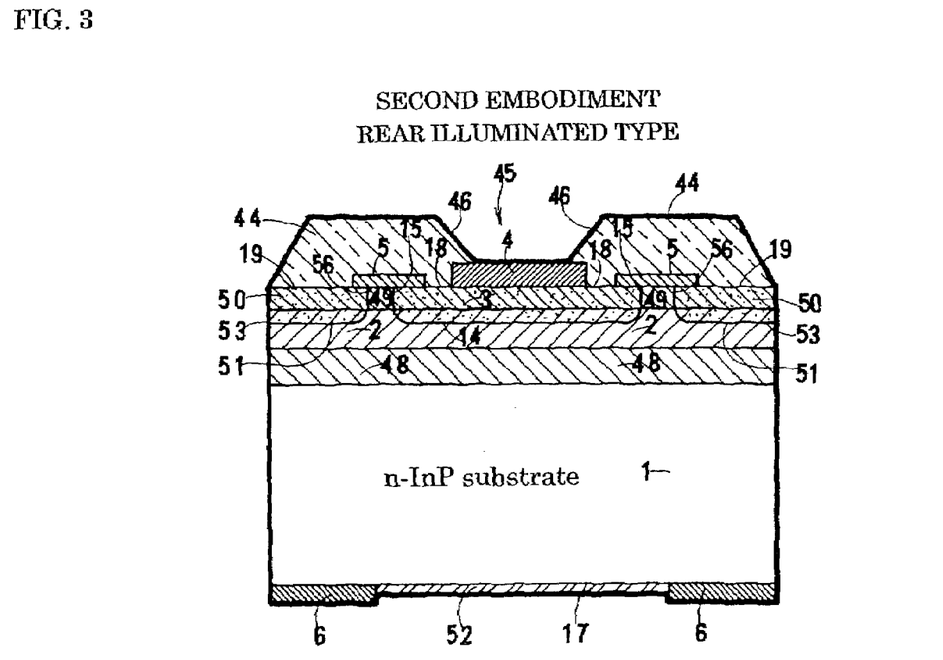
FIG. 3 is a longitudinal cross-sectional view of a rear illuminated photodiode according to a second embodiment of the present invention in which a passivation film and an upper exposed portion are covered with a protective layer and a diffusion shielding layer is provided.

FIG. 3 is a cross-sectional view of a rear illuminated PD provided with a protective layer and a diffusion shielding layer according to a second embodiment of the present invention. A cap layer and a buffer layer are provided in the crystal structure, and an annular p-type layer as the diffusion shielding layer is provided at the peripheral portion of the top face of the PD.

An n-InP buffer layer 48, an n-InGaAs absorption layer 2, and an n-InP cap layer 49 are deposited on an n-InP substrate 1 by epitaxial growth. The n-InP buffer layer 48 is deposited at a low temperature for improving the crystallinity of the n-InGaAs absorption layer 2. The n-InP cap layer 49 improves the ohmic contact between a p-type region and a p-electrode. The n-InP cap layer 49 is called a window layer for receiving light in a front illuminated type, although it is called a cap layer in a rear illuminated type since no light passes it.

The buffer layer and the cap layer are often provided in InP PDs. The central portion of the n-InP cap layer 49 and the n-InGaAs absorption layer 2 is a circular central p-type region 3, and the peripheral portion of these layers 49 and 2 is an annular p-type region 50. That is, these two p-type regions 3 and 50 are concentrically formed by zinc diffusion.

A central p-n junction 14 and an annular peripheral p-n junction 51 are formed in the n-InP cap layer 49 and the n-InGaAs absorption layer 2. A Ti/Au p-electrode 4 is formed on the center of the p-type region 3. A passivation film 5 is formed on an intermediate region to which the two p-n junctions 14 and 51 are exposed. The ends 15 and 56 of the p-n junctions 14 and 51 are protected by the passivation film 5. This protection is automatically achieved by zinc diffusion through a mask of the passivation film 5 having the central opening and the peripheral exposed portion.

Electron-hole pairs generated from light incident on the peripheral portion of the PD slowly reach the p-n junction 14 and causes signal tailing. In order to recombine such electrons and holes (carriers), the peripheral p-type region called the diffusion shielding layer is provided.

An annular AuGeNi n-electrode 6 is formed on the rear face of the n-InP substrate 1. An antireflective film 52 is formed in a large bottom opening 17. The antireflective film 52 is a dielectric multilayer film that allows light with a predetermined wavelength to effectively pass without reflection. Signal light passes through the antireflective film 52 at the bottom opening 17.

A resin protective layer 44 covers the passivation film 5 and the exposed portion 18. The protective layer 44 also overlaps the p-electrode 4. The protective layer 44 has a central opening 45 to which the p-electrode 4 is exposed. The wall portion of the opening 45 in the protective layer is an inclined plane 46 having a cone-shaped cross-section. The second embodiment is characterized in that the protective layer 44 covers the passivation film 5 and the peripheral region 19 of the p-electrode 4. The protective layer 44 also covers a gap between the p-electrode 4 and the passivation film 5. In this embodiment, the protective layer 44 protects the two p-n junctions 14 and 51. The peripheral ends 53 of the p-n junction 51 are exposed to the side faces, but this does not matter because the diffusion shielding layer 50 has nothing to do with taking out of signals.

In the Si wafer step, such PD chips are mounted and thereafter the Si wafer is diced as in the first embodiment. Since the ends of the p-n junctions are protected by the protective layer 44, contaminations 40 adhered to the PD during mechanical dicing do not cause problems.

A method for making the PD will now be described. An n-InP buffer layer 48 with a thickness of 2 µm, an n-InGaAs absorption layer 2 with a thickness of 4 µm, and an n-InP cap layer 49 are epitaxially deposited on an n-InP wafer with a thickness of 300 µm. The product is called an epitaxial wafer. An SiN mask with a thickness of 0.3 µm (which later becomes a passivation film) is formed on the n-InP cap layer 49 by sputtering or CVD. A central opening with a diameter of 100 µm and a concentric peripheral opening are provided for each chip unit by photolithography. Thus, the SiN mask is annular. The n-InP wafer is subjected to zinc thermal diffusion in a diffusion furnace. Vaporized zinc is thermally diffused into the interior from the opening of the mask on the top face of the n-InP wafer such that the central p-type region 3 and the annular p-type region 50 are thereby formed. Since zinc is diffused into a region below the SiN mask, the ends of the p-n junctions are formed immediately below the mask. A p-electrode 4 is provided on the central p-type region 3. A step for processing the top face of the n-InP wafer is thereby completed.

An annular n-electrode (AuGeNi) 6 is provided on the rear face of the n-InP substrate. An antireflective film 52 is provided in a bottom opening 17 in the center of the rear face. The antireflective film 52 is composed of a dielectric material such as SiON. The antireflective film 52 prevents signal light reflecting at the rear face due to a difference in diffractive index. A multilayer antireflective film has a highly antireflective effect. However, an effective and simplified structure may be a single dielectric layer having an effective thickness that is ¼ the wavelength λ of the signal light (nd=λ/4) and a diffractive index that is lower than that of the InP.

A fluorinated polyimide resin is applied onto the InP wafer into a thickness of 30 μm and is cured to form a protective layer 44. The protective layer 44 is processed by photolithography to form recesses at boundaries of individual chip units and openings 45 at positions corresponding to the p-electrodes. The recesses at the boundaries facilitate separations into chips. Thus, the wafer fabrication process is completed. The thin wafer is vertically and horizontally separated by spontaneous cleavage into individual PD chips. Each PD chip measures 500 μm by 500 μm.

As described in the first embodiment, a V-groove, a marker, and a metallized pattern are formed on each Si bench section of the Si wafer and PD chips are mounted onto the Si wafer. The Si wafer step is thereby completed. The Si wafer is diced into individual Si benches. Discrete chips are obtained by separating from a wafer in a similar manner. However, separation of the PD chips is different from that of the Si benches. The PD chips having a side length of about 0.6 to 0.3 mm is obtained from a 2- to 4-inch InP wafer. In contrast, the rectangular Si benches having a side length of 5 to 20 mm are obtained by separating from an 8- to 12-inch Si wafer.

Even if contaminations adhere tightly to the PDs, the ends of the p-n junctions, which are highly protected by the passivation film and the protective layer 44, are not contaminated. Thus, the protective layer 44 prevents deterioration of the p-n junctions.

Contaminations that inevitably adhere to the outside of the protective layer do not cause problems. In this embodiment, the passivation film 5 has a thickness of 0.3 μm and the fluorinated polyimide protective layer 44 has a thickness of 30 μm, which is 100 times that of the passivation film 5. The relative dielectric constant of SiN is 4, and that of the fluorinated polyimide is about 3.5. The electric capacitance of the dielectric layer is represented by $\in S/d$ wherein S is area, $\in$ is dielectric constant, and d is thickness. Since $\in$ is substantially the same in these layers, the ratio of the electric capacitance of the protective layer to that of the passivation film is nearly equal to the inverse of the ratio of the thickness, namely, about 1:100. Even if charged contaminations such as sodium ions adhere onto the protective layer, the effect of the contaminations is decreased to about 1/100 that of a case that only a passivation film is formed. Accordingly, charges on the protective layer do not adversely affect the p-n junctions.

THIRD EMBODIMENT (FRONT ILLUMINATED TYPE PD: DIFFUSION SHIELDING LAYER AND ANTIREFLECTIVE FILM, FIG. 4)

Figure 4:
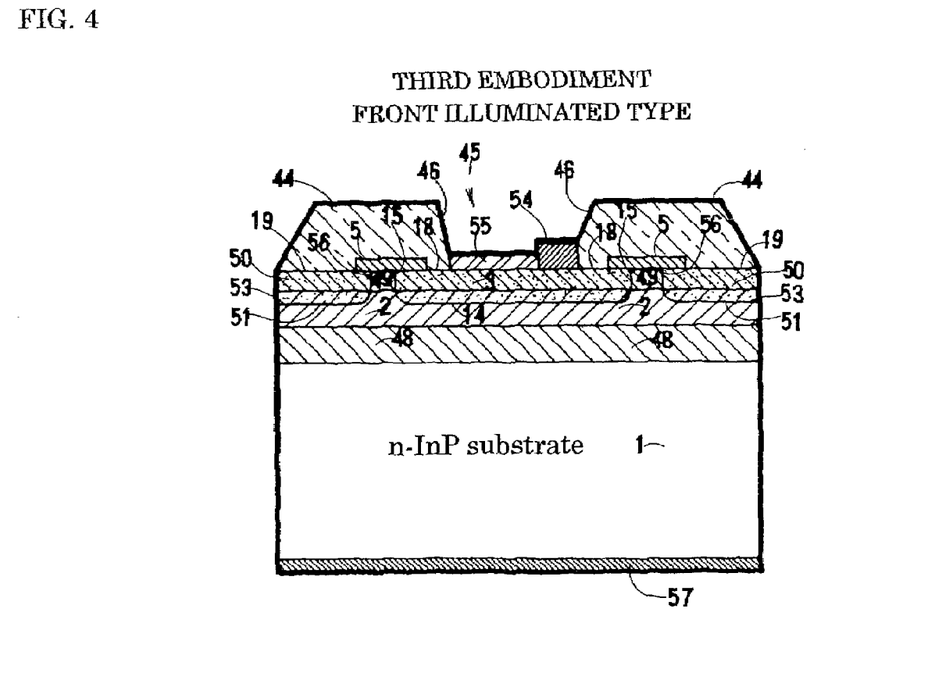
FIG. 4 is a longitudinal cross-sectional view of a front illuminated photodiode according to a third embodiment of the present invention in which a passivation film, and an upper exposed portion are covered with a protective layer and a diffusion shielding layer is provided.

The present invention is also applicable to a front illuminated photodiode. FIG. 4 is a cross-sectional view of a front illuminated photodiode having a protective layer and a diffusion shielding layer according to a third embodiment of the present invention. A small dot p-electrode is provided on the top face of the PD such that light enters the top face through the opening in the center of the top face, which is covered with an antireflective film. The rear face, on which light is not to be incident, is covered by an n-electrode. In this embodiment, the diffusion shielding layer and a window or cap layer are provided. The diffusion shielding layer and the window layer may be omitted.

An n-InP buffer layer 48, an n-InGaAs absorption layer 2, and an n-InP window or cap layer 49 are epitaxially deposited on an n-InP substrate 1. An annular passivation film 5 is formed on the top face as in the second embodiment, and zinc is thermally diffused from the top face to form a circular central p-type region 3 in the center and an annular peripheral p-type region 50 at the peripheral region, respectively in the n-InP cap layer 49 and the n-InGaAs absorption layer 2. The peripheral p-type region 50 functions as a diffusion shielding layer. A central p-n junction 14 and an annular peripheral p-n junction 51 are formed in the n-InP cap layer 49 and the n-InGaAs absorption layer 2.

A small dot p-electrode 54 made of Ti/Au is formed on the central p-type region 3. Light is to be incident on the remaining portion of the central p-type region 3. An antireflective film 55 is formed on the remaining portion of the p-type region 3 to prevent the reflection of signal light. The entire bottom face, on which the signal light is not to be incident, of the n-InP substrate 1 is covered with an AuGeNi n-electrode 57.

A resin protective layer 44 covers the passivation film 5, a central exposed portion 18, and a peripheral exposed region 19. The protective layer 44 has a central opening 45 in which the p-electrode 54 and the antireflective film 55 are provided.

Since this PD is of a front illuminated type, the PD is inversely provided on an Si bench when this PD is mounted on an Si bench shown in FIGS. 11 and 12. In a wafer fabrication process, V-grooves, markers, and metallized patterns are formed on an Si wafer and the PD chips are inversely fixed to the Si wafer. The Si wafer is diced into Si benches. The bottom face on which light is to be incident is also contaminated by dicing dust, dicing solution residues, and sodium ions. Since the bottom face is covered with the protective layer, deterioration of the p-n junctions does not occur. Thus, the device maintains satisfactory characteristics.

FOURTH EMBODIMENT (FRONT ILLUMINATED TYPE PD: DIFFUSION SHIELDING LAYER AND ANTIREFLECTIVE FILM, FIG. 5)

Figure 5:
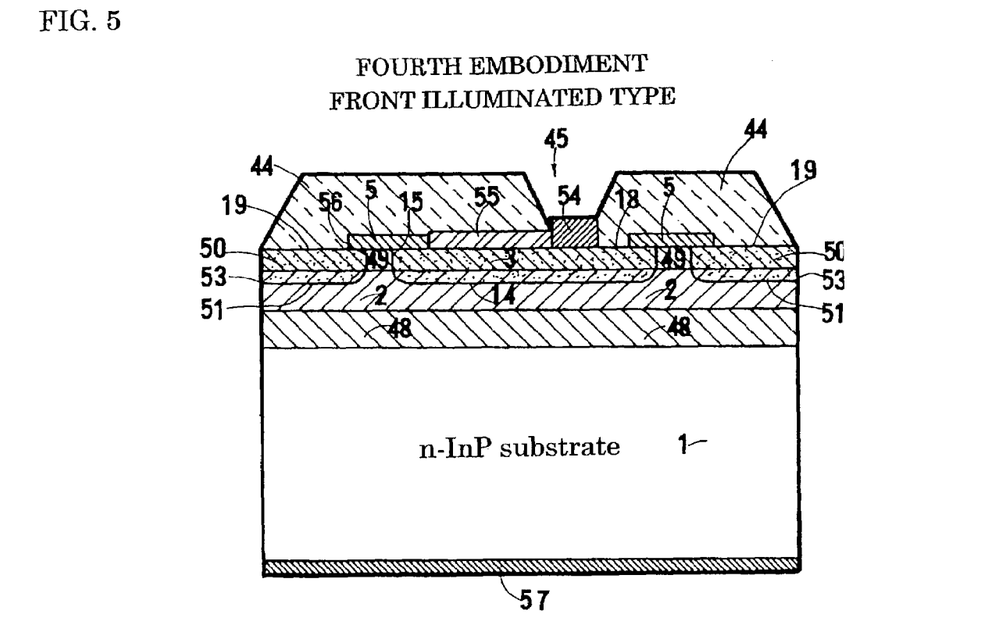
FIG. 5 is a longitudinal cross-sectional view of a front illuminated photodiode according to a fourth embodiment of the present invention in which a passivation film, an antireflective film, and an upper exposed portion are covered with a protective layer and a diffusion shielding layer is provided.

In a fourth embodiment shown in FIG. 5, an antireflective film at the top face of a front illuminated photodiode is also covered with a protective layer. The thick protective layer thoroughly prevents contaminations from penetrating into a portion under the passivation film.

An n-InP buffer layer 48, an n-InGaAs absorption layer 2, and an n-InP cap layer 49 are epitaxially deposited on an n-InP substrate 1. An annular passivation film 5 is formed on the top face as in the first and second embodiments. Zinc is thermally diffused from the top to form a circular central p-type region 3 and an annular peripheral p-type region (diffusion shielding layer) 50 in the n-InP cap layer 49 and the n-InGaAs absorption layer 2. A central p-n junction 14 and an annular peripheral p-n junction 51 are formed in the n-InP cap layer 49 and the n-InGaAs absorption layer 2.

A small dot p-electrode 54 made of Ti/Au is formed on the central p-type region 3. An antireflective film 55 is formed on the remaining portion of the p-type region 3. The entire bottom face of the n-InP substrate 1 is covered with an AuGeNi n-electrode 57.

A resin protective layer 44 of a transparent resin covers the antireflective film 55, the passivation film 5, a central exposed portion 18, and a peripheral exposed region 19. Since the protective layer 44 is transparent and transmits signal light, it also covers the antireflective film 55 in this embodiment. The protective layer 44 has a small central opening 45 in which the p-electrode 54 is provided.

Since this PD is of a front illuminated type, the PD is inversely provided on an Si bench when this PD is mounted on an Si bench shown in FIGS. 11 and 12. Since the p-electrode is in the downward direction, it must be connected in a special manner. This PD is suitable for normally positioned attachment to the Si bench. In a wafer fabrication process, V-grooves, markers, and metallized patterns are formed on an Si wafer and the PD chips are fixed to the Si wafer. The Si wafer is diced into Si benches. The surfaces of the PDs are contaminated by dicing dust, dicing solution residues, and sodium ions. Since the PDs have the protective layer, deterioration of the p-n junctions does not occur. Thus, the device maintains satisfactory characteristics.

FIFTH EMBODIMENT (FRONT ILLUMINATED TYPE PD: DIFFUSION SHIELDING LAYER AND ANTIREFLECTIVE FILM, FIG. 6)

Figure 6:
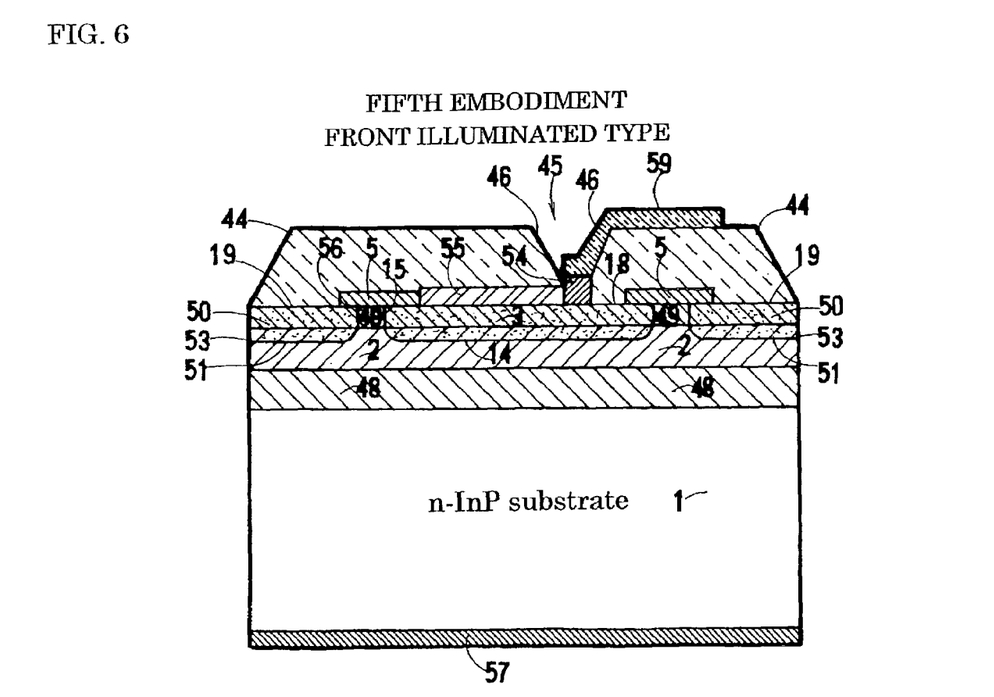
FIG. 6 is a longitudinal cross-sectional view of a front illuminated photodiode according to a fifth embodiment of the present invention in which a passivation film, an antireflective film, and an upper exposed portion are covered with a protective layer, an extension bonding pad is provided to a p-electrode, and a diffusion shielding layer is provided.

In a fifth embodiment shown in FIG. 6, a front illuminated photodiode is provided with an extension bonding pad and a p-electrode is narrowed such that an antireflective film on the top face is covered with a protective layer to maximize the area of the protective layer. Thus, the area not covered with the protective layer is minimized. This structure can more thoroughly prevent contaminations from penetrating into a portion under the passivation film.

An n-InP buffer layer 48, an n-InGaAs absorption layer 2, and an n-InP cap layer 49 are epitaxially deposited on an n-InP substrate 1. An annular passivation film 5 is formed on the top face as in the second and third embodiments. Zinc is thermally diffused from the top to form a circular central p-type region 3 and an annular peripheral p-type region (diffusion shielding layer) 50 in the n-InP cap layer 49 and the n-InGaAs absorption layer 2. A central p-n junction 14 and an annular peripheral p-n junction 51 are formed in the n-InP cap layer 49 and the n-InGaAs absorption layer 2.

A small dot p-electrode 54 made of Ti/Au is formed on the central p-type region 3. An antireflective film 55 is formed on the remaining portion of the p-type region 3. The entire bottom face of the n-InP substrate 1 is covered with an AuGeNi n-electrode 57.

A resin protective layer 44 of a transparent resin covers the antireflective film 55, the passivation film 5, a central exposed portion 18, and a peripheral exposed region 19 on the top face. Since the protective layer 44 is transparent and allows signal light to pass therethrough, it also covers the antireflective film 55 in this embodiment. The protective layer 44 has a small central opening 45 in which the small dot p-electrode 54 is provided. The p-electrode 54 is too narrow to ensure wire bonding. Thus, a gold bonding pad 59 is provided over the p-electrode 54 and an inclined plane 46 and the top face of the protective layer 44.

Since this PD is of a front illuminated type, the PD is inversely provided on an Si bench when this PD is mounted on an Si bench shown in FIGS. 11 and 12. The bonding pad 59 is directly soldered to the metallized pattern on the Si bench face. In a wafer fabrication process, V-grooves, markers, and metallized patterns are formed on an Si wafer and the PD chips are inversely fixed to the Si wafer. The Si wafer is diced into Si benches. The bottom face, on which light is to be incident, of the PD is contaminated by dicing dust, dicing solution residues, and sodium ions. However, since the bottom face is covered with the protective layer, deterioration of the p-n junctions does not occur. Thus, the device maintains satisfactory characteristics. In this embodiment, the portion on which light is to be incident is covered with the transparent protective layer such that nearly the entire top face is covered by the transparent protective layer. Thus, the PD is more securely protected compared with the fourth embodiment.

SIXTH EMBODIMENT (REAR ILLUMINATED TYPE PD: DIFFUSION SHIELDING LAYER AND ANTIREFLECTIVE FILM, FIG. 7)

Figure 7:
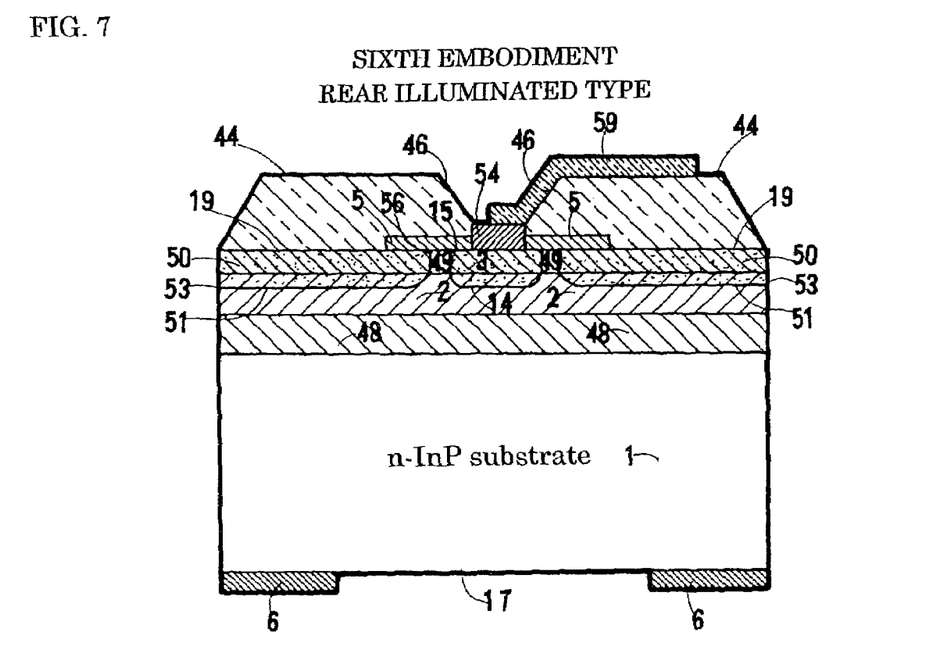
FIG. 7 is a longitudinal cross-sectional view of a rear illuminated photodiode according to a sixth embodiment of the present invention in which a passivation film and an upper exposed portion are covered with a protective layer, an extension bonding pad is provided to a p-electrode, and a diffusion shielding layer is provided.

The fifth embodiment is applied to a rear illuminated type of a sixth embodiment as shown in FIG. 7. That is, a rear illuminated photodiode is provided with an extension bonding pad such that the p-electrode is further narrowed and the area of the protective layer is maximized. A portion not covered with the protective layer of the rear illuminated photodiode is minimized. In addition, the central p-type region is narrowed for reducing electric capacitance and enhancing the speed of response.

An n-InP buffer layer 48, an n-InGaAs absorption layer 2, and an n-InP cap layer 49 are epitaxially deposited on an n-InP substrate 1. An annular passivation film 5 that is narrower than that in the third, fourth, and fifth embodiments is formed on the top face. Zinc is thermally diffused from the top to form a circular central p-type region 3 and an annular peripheral p-type region (diffusion shielding layer) 50 in the n-InP cap layer 49 and the n-InGaAs absorption layer 2. A narrow central p-n junction 14 and an annular wide peripheral p-n junction 51 are formed in the n-InP cap layer 49 and the n-InGaAs absorption layer 2.

A significantly small dot p-electrode 54 made of Ti/Au is formed on the narrow central p-type region 3 surrounded by the passivation film 5. An annular AuGeNi n-electrode 6 is formed on the bottom face of the n-InP substrate 1. Signal light is incident on an opening 17 at the bottom center.

A resin protective layer 44 of a transparent resin covers the passivation film 5 and a peripheral exposed region 19 on the top face. The protective layer 44 has a narrow opening 45 in the center and a small dot p-electrode 54 is provided in the opening 45. The p-electrode 54 is too narrow to ensure wire bonding. Thus, a gold bonding pad 59 is provided over the p-electrode 54, an inclined plane 46 of the protective layer 44, and the top face of the protective layer 44. The width of the bonding pad 59 is about 100 μm on the top face. The chip measures 500 μm by 500 μm. The diameter of the central p-type region is 30 μm. Both the central p-type region 3 and the p-n junction 14 are narrow; hence, the electric capacitance generated between the anode and the cathode by a reverse bias is further reduced. Thus, the speed of response is higher. This PD enables a high-rate reception of 1 Gbps to 5 Gbps.

This rear illuminated PD is normally provided on the Si bench as shown in FIGS. 11 and 12. In a wafer fabrication process, V-grooves, markers, and metallized patterns are formed on an Si wafer and the PD chips are inversely fixed to the Si wafer. The Si wafer is diced into Si benches. The surface of the PDs are contaminated by dicing dust, dicing solution residues, and sodium ions. Since the surface is covered with the protective layer, deterioration of the p-n junctions does not occur. Thus, the device maintains satisfactory characteristics.

Figure 15:
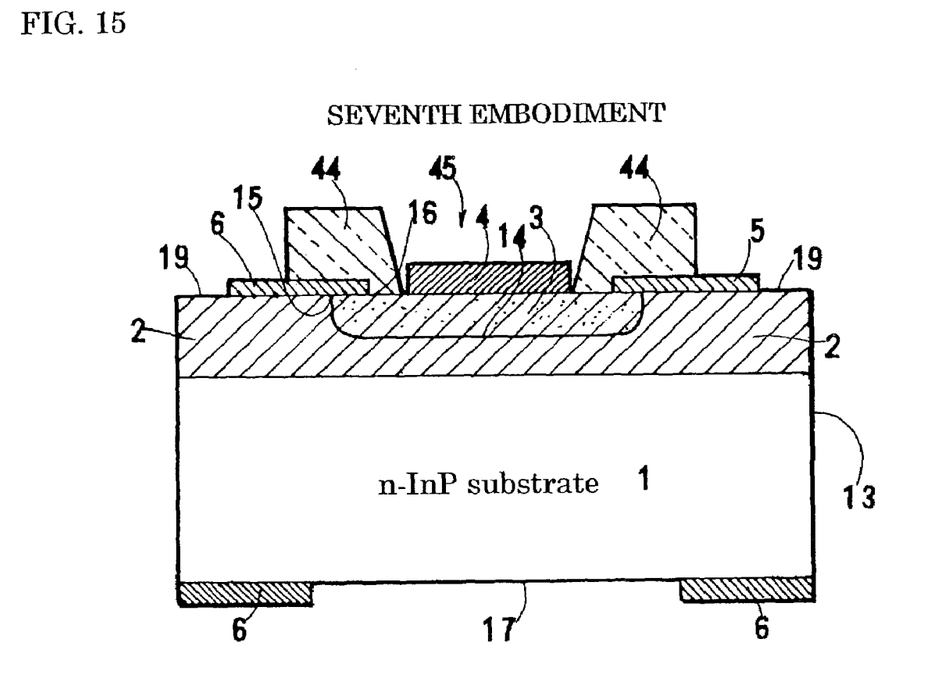
FIG. 15 is a longitudinal cross-sectional view of a rear illuminated photodiode according to a seventh embodiment of the present invention in which a passivation film is provided for covering the top end of a p-n junction and exposing a peripheral region, and the passivation film and an upper exposed portion are covered with the protective layer, and a diffusion shielding layer is not provided.

SEVENTH EMBODIMENT (REAR ILLUMINATED TYPE PD: FIG. 15)

FIG. 15 is a cross-sectional view of a rear illuminated PD provided with a protective layer according to a seventh embodiment of the present invention. In this embodiment, a narrow passivation film 5 covers only a limited area at and near the end 15 of a p-n junction 14. A peripheral region 19 of the chip is not covered by the passivation film 5. Since the passivation film 5 is provided to cover the end 15 of the p-n junction 14 for preventing degradation of the p-n junction 14, such a limited passivation film 5 is also available in the present invention. A protective layer 44 may cover the entire passivation film 5. Alternatively, as shown in FIG. 15, the protective layer 44 may cover at least the inner end 16 of the passivation film 5 and the end 15 of the p-n junction 14. Since the passivation film 5 functions as a zinc diffusion mask, the passivation film 5 is made of SiN and has a mask pattern as in the first embodiment. Zinc is diffused through this mask to form a p-type region. The outer portion of the passivation film 5 is then removed to expose the peripheral region 19 of the chip. Also the protective layer 44 is provided so as to cover the entire surface, then the center corresponding to an opening 45 and the periphery corresponding to a peripheral region 19 are removed, as shown in FIG. 15. The protective layer 44 must cover area extending from the inner end 16 of the passivation film 5 toward the center by 10 μm and toward the periphery by 10 to 20 μm. The passivation film is not necessary in other portions from the viewpoint of protection of the end 15 of the p-n junction 14. Accordingly, a limited passivation film and a limited protective layer as shown in FIG. 15 are available in the present invention.

What is claimed is:

1. A photodiode comprising:
   a substrate;
   an absorption layer;
   a p-n junction in the absorption layer;
   a passivation film for protecting the end of the p-n junction;
   a p-electrode; and
   an n-electrode,
   wherein the passivation film is covered with a protective layer that is composed of an insulative resin and has a thickness in the range of 5 μm to 50 μm.

2. The photodiode according to claim 1, wherein the protective layer covers at least the inner end and the adjoining portion of the passivation film, the adjoining portion lying above the p-n junction.

3. The photodiode according to claim 1, wherein the thickness of the protective layer is 10 times to 100 times the thickness of the passivation film.

4. The photodiode according to claim 1, wherein the protective layer is made of a polymer.

5. The photodiode according to claim 1, further comprising a conductive film extending from an electrode located at the side of the protective layer to the surface of the protective layer, wherein part of the conductive film functions as a bonding pad for electrical connection with an exterior.

6. The photodiode according to claim 1, wherein the substrate is an InP substrate, the absorption layer is an InGaAs or InGaAsP absorption layer, and the p-n junction is formed by zinc diffusion.

7. The photodiode according to claim 1, wherein the substrate is an n-InP substrate, the absorption layer is an n-InGaAs or an n-InGaAsP absorption layer, the p-n junction is formed by zinc diffusion, an n-InP buffer layer is provided between the n-InP substrate and the absorption layer, and an n-InP cap layer is formed on the absorption layer.

8. The photodiode according to claim 1, further comprising a diffusion shielding portion, the diffusion shielding portion forming another p-n junction surrounding the p-n junction that exists in the area where light is to be incident.

9. A photodiode comprising:
   a substrate;
   an absorption layer;
   a p-n junction in the absorption layer;
   a passivation film for protecting the end of the p-n junction;
   a p-electrode; and
   an n-electrode,
   wherein the passivation film is covered with a protective layer that is composed of an insulative resin and has a thickness larger than that of the passivation film, and
   wherein the protective layer comprises at least one selected from the group consisting of a polyimide resin, a fluorinated polyimide resin, polymethyl methacrylate, an epoxy resin, and an ultraviolet-curable resin.

10. A photodiode of a from illuminated type comprising:
    a substrate;
    an absorption layer;
    a p-n junction in the absorption layer;
    a passivation film for protecting the end of the p-n junction;
    p-electrode on an entire surface of the substrate,
    wherein the passivation film is covered with a protective layer that is composed of an insulative,transparent resin and has a thickness larger than that of the passivation film, and
   wherein the protective larger covers the surface of the absorption layer.

* * * * *

UNITED STATES PATENT AND TRADEMARK OFFICE
CERTIFICATE OF CORRECTION

PATENT NO.           : 7,057,255 B2
APPLICATION NO.  : 10/320194
DATED                    : June 6, 2006
INVENTOR(S)          : Naoyuki Yamabayashi and Yoshiki Kuhara It is certified that error appears in the above-identified patent and that said Letters Patent is hereby corrected as shown below:

Col. 18, line 38 (Claim 10), "from" should be --front--;

Col. 18, line 44 (Claim 10), "p-electrode" should be --a p-electrode--;

Col. 18, line 49 (Claim 20), "larger" should be --layer--.

Signed and Sealed this

Nineteenth Day of December, 2006

JON W. DUDAS
*Director of the United States Patent and Trademark Office*